United States Patent [19]
Fujiwara et al.

[11] Patent Number: 5,938,857
[45] Date of Patent: Aug. 17, 1999

[54] METHOD FOR RINSING AND DRYING A SUBSTRATE

[75] Inventors: Shuji Fujiwara; Toshiyuki Hirota, both of Tokyo, Japan

[73] Assignee: NEC Corporation, Tokyo, Japan

[21] Appl. No.: 09/131,552

[22] Filed: Aug. 10, 1998

[30] Foreign Application Priority Data

Aug. 8, 1997 [JP] Japan .................................. 9-227396

[51] Int. Cl.$^6$ ...................................................... B08B 15/00
[52] U.S. Cl. ............................... 134/2; 134/11; 134/25.4; 134/95.2; 134/102.1
[58] Field of Search ................................. 134/2, 11, 902, 134/25.4, 95.2, 102.1

[56] References Cited

U.S. PATENT DOCUMENTS 5,520,744   5/1996   Fujikawa et al. .
5,685,086  11/1997   Ferrell .

FOREIGN PATENT DOCUMENTS 10163164   6/1998   Japan ........................... H01L 21/304
WO97/12392   4/1997   WIPO ........................... H01L 21/304

OTHER PUBLICATIONS

U.K. Search Report, Application No. GB 9817273.7, Nov. 13, 1998.
Semiconductor World, "Rinsing—its simplification and reliability", Press Journal, Mar. 1995.

*Primary Examiner*—Jill Warden
*Assistant Examiner*—Yolanda E. Wilkins
*Attorney, Agent, or Firm*—Foley & Lardner

[57] ABSTRACT

In a wafer rinsing and drying method, a wet-treated wafer is put in a treating bath located in a closed chamber and is rinsed by a rising stream of a deionized water while supplying from position higher than the treating bath a vapor of IPA which is a water soluble solvent acting to lower the surface tension of the deionized water, so that the surface tension of the deionized water bath is weakened, and the extremely fine particles remaining on the surface of the deionized water bath is removed together with the deionized water overflowing from an upper edge of the treating bath. Thereafter, the supplying of the deionized water is stopped, but the IPA vapor is blown on to the surface of the deionized water from the high position for a predetermined period of time, so that a stationary deionized water bath is formed and a uniform and thick liquid IPA layer is formed on the surface of the stationary deionized water bath. In this condition, the wafer is pulled up so that the deionized water on the wafer surface is replaced with the liquid IPA. Thereafter, the deionized water is exhausted from the treating bath, and the closed chamber is evacuated so that the wafer is dried.

21 Claims, 14 Drawing Sheets

Fig.5A

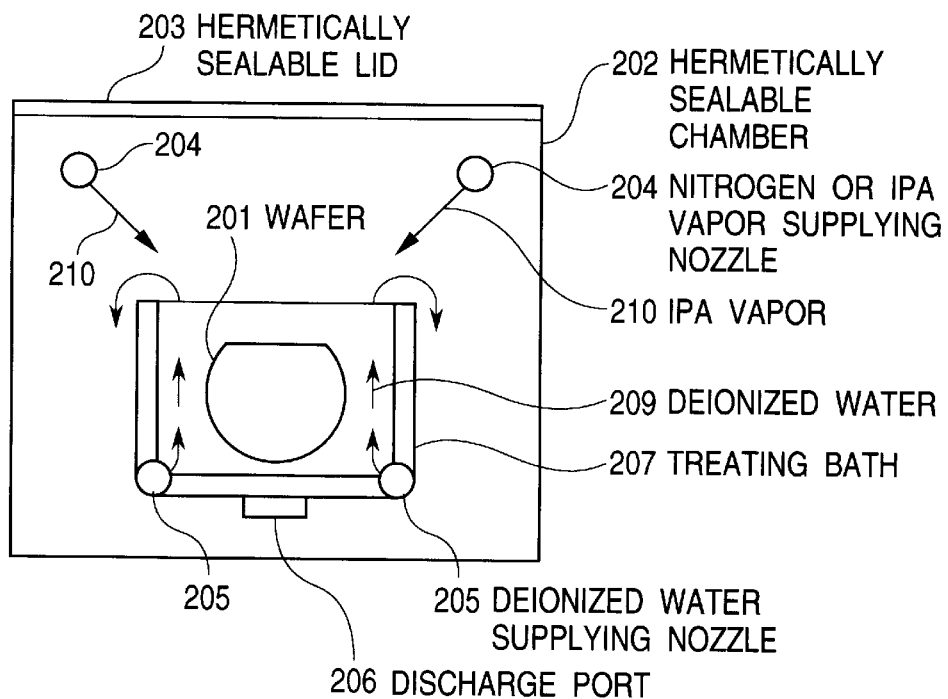

- 203 HERMETICALLY SEALABLE LID
- 202 HERMETICALLY SEALABLE CHAMBER
- 204 NITROGEN OR IPA VAPOR SUPPLYING NOZZLE
- 201 WAFER
- 210 IPA VAPOR
- 209 DEIONIZED WATER
- 207 TREATING BATH
- 205 DEIONIZED WATER SUPPLYING NOZZLE
- 206 DISCHARGE PORT

Fig.5B

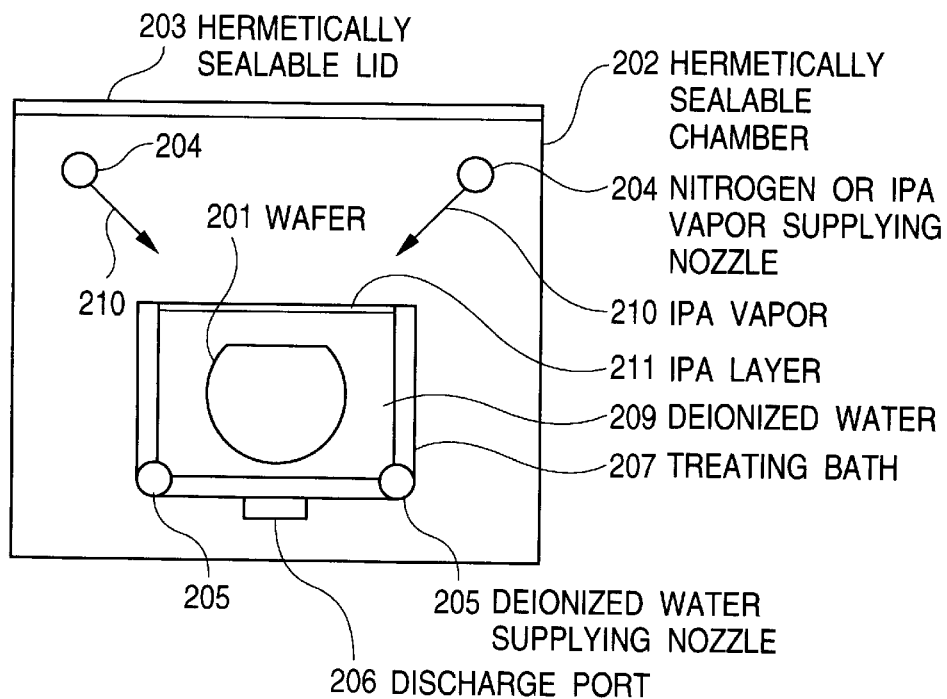

- 203 HERMETICALLY SEALABLE LID
- 202 HERMETICALLY SEALABLE CHAMBER
- 204 NITROGEN OR IPA VAPOR SUPPLYING NOZZLE
- 201 WAFER
- 210 IPA VAPOR
- 211 IPA LAYER
- 209 DEIONIZED WATER
- 207 TREATING BATH
- 205 DEIONIZED WATER SUPPLYING NOZZLE
- 206 DISCHARGE PORT

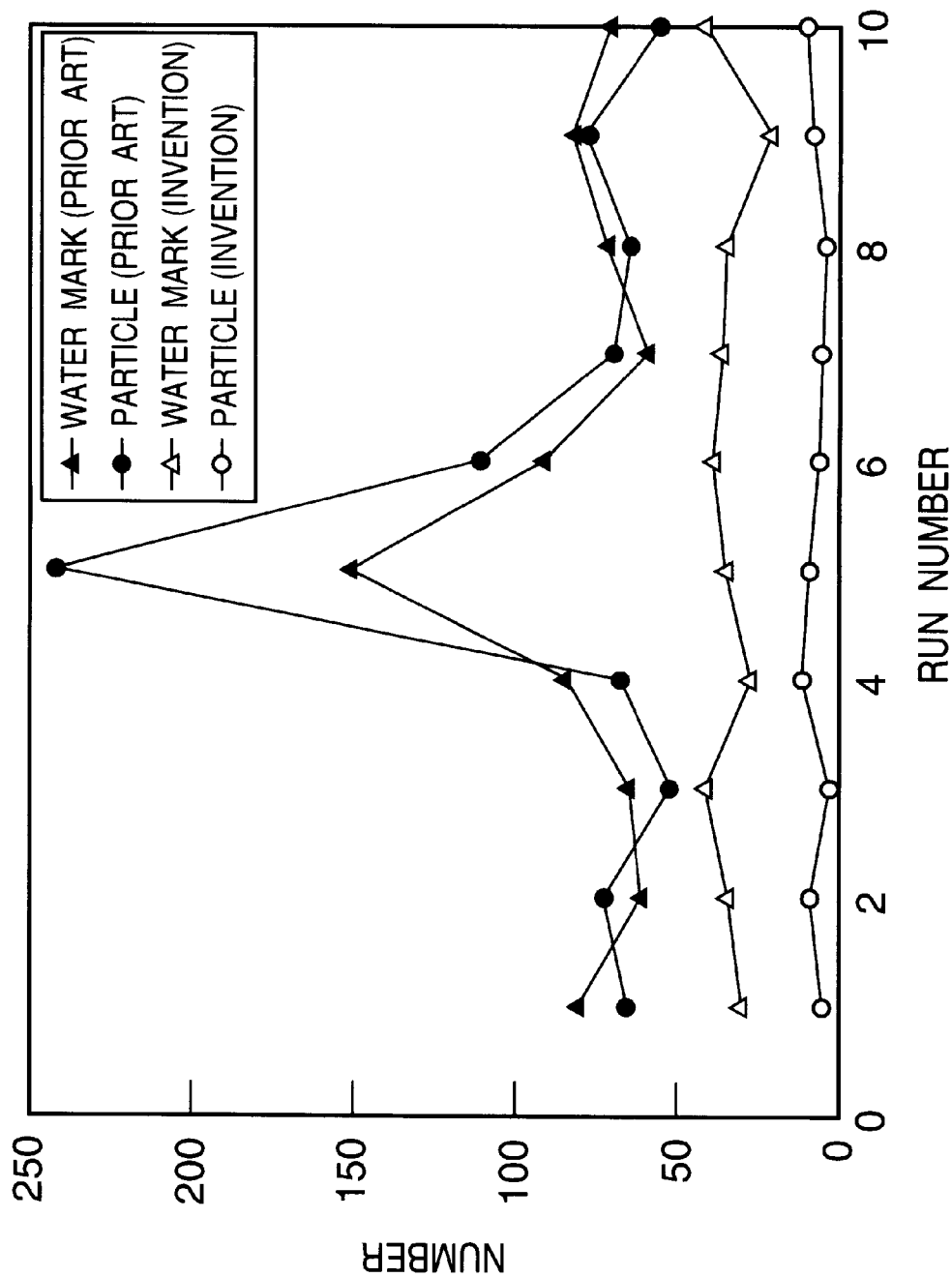

METHOD FOR RINSING AND DRYING A SUBSTRATE

BACKGROUND OF THE INVENTION

1. Field of the Invention

The present invention relates to a process for manufacturing a semiconductor device, and more specifically to a method for rinsing and drying a semiconductor substrate, i.e., wafer, that was wet-treated with various chemicals.

2. Description of Related Art

Mass production of a semiconductor device has already entered into the age of the sub-micron, and a weight of development has been shifted into the next stage of a half-micron. With this advanced microfabrication, an ultra-micro foreign matter and a slight stain adhered to a wafer in the process results in a defective wafer, with the result that the importance of a rinsing technology is recognized anew, and elevation of the rinsing performance is desired.

In the Japanese language monthly magazine "Semiconductor World", March, 1995, Press Journal, the special edition entitled "Rinsing - its simplification and reliability" explains the present situation of the rinsing technology.

In the prior art, a wafer etching and rinsing method of a multi-bath process is known. For example, a series of treatments are sequentially executed which fundamentally use an APM (ammonia-hydrogen peroxide mixed water= $NH_4OH/H_2O_2/H_2O$), an HPM (hydrochloric acid-hydrogen peroxide mixed water=$NCl/H_2O_2/H_2O$), and a DHF (diluted hydrofluoric acid=$HF/H_2O$), in combination with an SPM (sulfuric acid-hydrogen peroxide mixed water=$H_2SO_4/H_2O_2/H_2O$), a BHF (buffered hydrofluoric acid) and a FPM (hydrofluoric acid-hydrogen peroxide mixed water=$HF/H_2O_2/H_2O$), if necessary.

FIG. 1 shows one example of the wafer etching and rinsing method in the multi-bath process. In brief, a wafer is mounted on a loader "a", and then is fed to an APM chemicals bath "b", an DHF chemicals bath "d" and an HPM chemicals bath "f", in the named order. In this case, a QDR (quick dump rinse) bath "c", "e" or "g" is located between each pair of adjacent chemicals baths, in order to rinse the wafer with deionized water, thereby to prevent the chemicals from entering into the next downstream chemicals bath.

The wafer delivered from the QDR bath "g" is fed through a rinse bath "h" to a wafer drying chamber "i" of a spin dryer type or an IPA (isopropyl alcohol) vapor drying type. Thereafter, the wafer is fed to an unloader "j".

In the above mentioned multi-bath wafer rinsing and drying method, if the mechanism for circulating and filtering the chemicals is used, it is possible to advantageously reduce the consumed amount of chemicals to a limit within a contamination range sufficiently permitting the use of the chemicals. Since a number of baths are used, the throughput is high in some cases depending upon the process to be performed. However, since the wafer must be delivered in the atmosphere, there is high possibility that dust occurs in the course of delivering the wafer in the atmosphere, and water marks often occur.

There is a single-bath type, which is opposite to the multi-bath type. In this single-bath type, all of a wet etching by chemicals, a rinsing by chemicals, a rinsing by deionized water, and a drying are carried out in a single bath. Accordingly, a liquid must be replaced by another at each time each processing is to be carried out, with the result that the amount of used chemicals becomes large. In addition, the throughput is low. However, since chemical water solution is replaced with another at each processing step, there is less re-contamination due to particles or dirt remaining in the chemical solution. This is the most important advantage of the single bath type. In connection with the cost, the increase of the amount of used chemicals is prevented by adopting a dilution process.

Referring to FIGS. 2A to 2H, explanation will be made on an example of a prior art single bath wet-process utilizing an IPA drying, which is considered to be effective in reducing the particles and the water marks in comparison with the multi-bath type, and which is disclosed by U.S. Pat. No. 5,520,744, to Fujikawa, et. al. content of which is incorporated by reference in its entirety into this application. FIGS. 2A to 2H are diagrammatic sectional views of the single bath wet-treating unit substantially corresponding to that shown in FIG. 6 of U.S. Pat. No. 5,520,744. This single bath wet-treating unit includes a hermetically sealable chamber 402 having a top closed and opened by a hermetically sealable lid 403. Within this hermetically sealable chamber 402, a treating bath 407 is located, and nitrogen or IPA vapor supplying nozzles 404 are mounted at an upper position. The treating bath 407 has deionized water supply nozzles 405 located at a peripheral portion of the bottom, and a discharge port 406 formed at a center of the bottom. In FIGS. 2A to 2H, a pipe layout for supplying necessary liquid and gas and for exhausting unnecessary liquid and gas is omitted for simplification of the drawing.

In the single bath wet-process, first, a wafer 401 is introduced into the treating bath 407 by means of a conveying cassette (not shown) so that the wafer is immersed in deionized water 409 in the treating bath 407. Thereafter, the chamber 402 is closed with the lid 403 so as to complete a hermetically sealed space defined by the chamber 402 and the lid 403, and nitrogen is supplied through the nitrogen or IPA vapor supplying nozzles 404.

In this condition, the deionized water is supplied from the deionized water supplying nozzles 405 so that a rising stream of deionized water is generated. Accordingly, the wafer 401 is put in the rising stream of deionized water for a predetermined period of time, as shown in FIG. 2A. Thus, particles are removed from a surface of the wafer 401, and are exhausted from the treating bath 407 together with the deionized water 409 overflowing from an upper edge of the treating bath 407.

Then, without exposing the wafer 401 to the atmosphere, the deionized water is replaced with a chemical solution, for example, the DHF liquid 410, which is therefore supplied through the nozzles 405 so as to fill the treating bath 407 with the DHF liquid 410. In this condition, an etching is carried out for a predetermined period of time, as shown in FIG. 2B. At this time, the nitrogen is still supplied from the nozzles 404.

Thereafter, without exposing the wafer 401 to the atmosphere, the DHF liquid 410 is replaced with the deionized water, which is therefore supplied through the nozzles 405, and the wafer 401 is rinsed with a rising stream of deionized water 409 for a predetermined period of time. In this process, particles removed from the surface of the wafer 401 and diffused into the deionized water 409, are exhausted from the treating bath 407 together with the deionized water 409 overflowing from the upper edge of the treating bath 407, as shown in FIG. 2C. At this time, the nitrogen is still supplied from the nozzles 404.

When the rinsing of the wafer 401 is completed, as shown in FIG. 2D, a vapor 411 of an organic solvent, for example, IPA, which is soluble to water and which acts in lower the surface tension of the deionized water, is supplied toward an upper position of the treating bath 407 from the nitrogen or IPA vapor supplying nozzles 404, by using the nitrogen gas as a carrier. Thereafter, the wafer 401 is pulled up from the treating bath 407, as shown in FIG. 2E.

In the process described above, since a thin IPA layer 412 is formed on a surface of the deionized water 409, the deionized water on the wafer 401 is replaced with the IPA when the wafer 401 is pulled up, so that the wafer 401 will be dried quickly. Here, the water soluble organic solvent acting to lower the surface tension of deionized water can be exemplified by the alcohol family, the ketone family and the ethyl family, but the IPA is the most preferable because IPA containing a lasser amount of impurities, such as metal, is commercially easily available.

If the pulling-up of the wafer 401 from the deionized water 409 is completed, the supplying of the IPA vapor 411 is stopped, and the supplying of only the nitrogen 408 is started. In addition, the supplying of the deionized water 409 to the treating bath 407 is stopped, and simultaneously, the deionized water 409 is discharged from the treating bath 407 through the discharge port 406, as shown in FIG. 2F.

After the deionized water 409 is discharged from the treating bath 407, the supplying of the nitrogen gas is stopped. At the same time, the hermetically sealed chamber 402 is evacuated by a vacuum pump (not shown) so that the hermetically sealed chamber 402 is put in a reduced pressure condition, as shown in FIG. 2G. The result is that the IPA on the surface of the wafer 401, which was substituted for the deionized water, is caused to evaporate, and therefore, the wafer 401 is dried.

After completion of the drying of the wafer 401, the supplying of the nitrogen gas 408 is, started. Thereafter, when a time of, for example, about 30 seconds has elapsed, the vacuum pump is stopped, so that the pressure in the hermetically sealed chamber 402 is restored from the reduced pressure condition to the pressure of the atmosphere, as shown in FIG. 2H.

After the pressure of the atmosphere is restored, the lid 403 is opened, and the wafer 401 is taken out.

In the above mentioned wafer etching and rinsing method, before the pulling-up of the wafer, the vapor of the organic solvent is blown against the rising stream of the deionized water. However, the deionized water is overflowed from the treating bath, and in addition, the water surface is heaving because of the rising stream of the deionized water, with the result that a uniform thick IPA layer can never be formed on the deionized water surface.

In addition, if the wafer is rinsed in the nitrogen atmosphere after the wet-process is carried out, even if the wafer is put in the rising water stream, since the deionized wafer water has a high surface tension, it is difficult to exhaust extremely fine particles of,for sample, not larger than 0.2 $\mu$m in the proximity of the treating bath surface.

Furthermore, the particles remaining in the treating bath adhere to the wafer in succeeding processing.

The particles which could not be exhausted, prevent formation of the uniform organic solvent layer on the wafer surface. Accordingly, when the wafer surface has convex and concave areas in particular, when the wafer surface includes a hydrophobic surface and a hydrophilic surface, the deionized water is apt to remain at its boundary, and therefore, the particles are adhered. If the particles are adhered, water marks are generated because of moisture included in the particles. In the process for forming a hemispherical grained silicon (called a "HGS-Si"hereinafter) by utilizing a migration of a silicon film, which is now expected as the capacitor electrode of a highly integrated DRAM such as the 64 Mbit DRAM and a succeeding generation of DRAMs, an extremely fine remaining, water prevents the migration of a silicon film. The result is that such a large problem occurs that the capacitance value of the DRAM capacitor becomes small and the yield of production and the reliability are deteriorated.

In order to solve the above mentioned problems, it is necessary to sufficiently exhaust the particles at the time of rinsing the wafer after the wet-process, and to form a uniform and thick organic solvent layer.

SUMMARY OF THE INVENTION

Accordingly, it is an object of the present invention to provide a wafer rinsing and drying method which has overcome the above mentioned problems of the prior art.

Another object of the present invention is to provide a wafer rinsing and drying method capable of sufficiently exhausting the particles at the time of rinsing the wafer and of forming a uniform and thick organic solvent layer, thereby to surely replace the deionized water on the wafer surface with the organic solvent even if the wafer surface has convex and concave areas, particularly, a hydrophobic surface and a hydrophilic surface in a mixed condition, with the result that the particles and the water marks adhered to the wafer can be minimized with a high reproducibility.

The above and other objects of the present invention are achieved in accordance with the present invention by a wafer rinsing and drying method including a first step of rinsing a wet-treated wafer put in a treating bath by a rising stream of deionized water while supplying from a position higher than the treating bath a vapor of a first water soluble organic solvent acting to lower the surface tension of the deionized water, a second step of stopping the rising stream of the deionized water and of supplying a vapor of a second water soluble organic solvent acting to lower the surface tension of the deionized water, from a position higher than the treating bath for a predetermined period of time, and a third step of pulling up the wafer from the treating bath.

The first water soluble organic solvent and the second water soluble organic solvent can be the same or different solvents. For example, the water soluble organic solvent acting to lower the surface tension of the deionized water can be exemplified by the alcohol family, the ketone family and the ethyl family.

In an embodiment, after the wafer is pulled up from the treating bath, the deionized water in the treating bath is exhausted, and a closed chamber including the wafer and the treating bath therein is evacuated so that the internal pressure of the closed chamber is lowered to dry the wafer.

The above and other objects, features and advantages of the present invention will be apparent from the following description of preferred embodiments of the invention with reference to the accompanying drawings.

BRIEF DESCRIPTION OF THE DRAWINGS

FIGS. 5A to 5F are diagrammatic sectional views of a rinsing and drying unit, for illustrating the second embodiment of the wafer rinsing and drying method in accordance with the present invention; and FIG. 6 is a graph showing the process stability of the wafer rinsing and drying method in accordance with the present invention and the prior art wafer rinsing and drying method.

DESCRIPTION OF THE PREFERRED EMBODIMENTS

Figure 1:
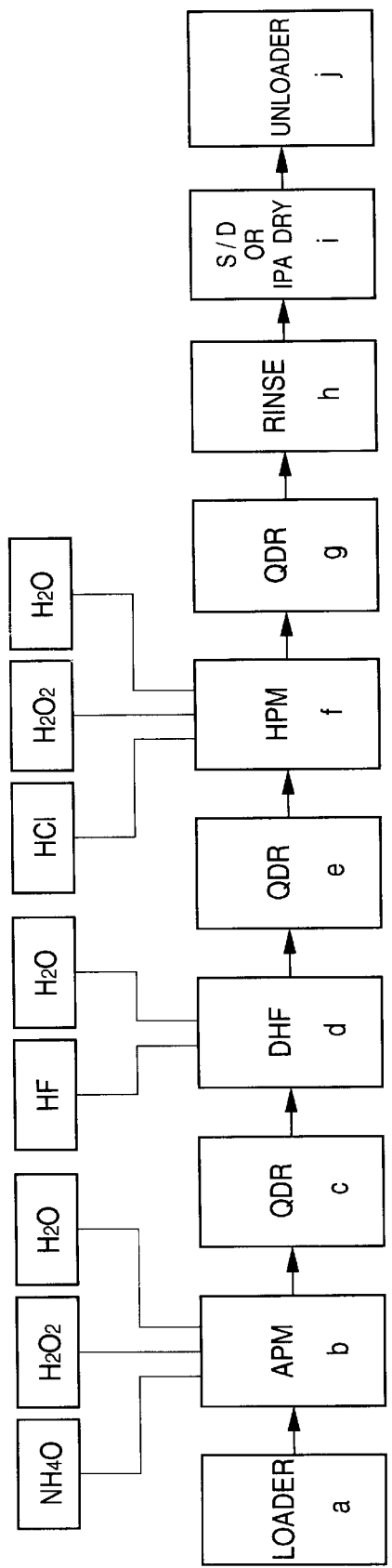
FIG. 1 shows one example of the prior art wafer etching and rinsing method in the multi-bath wet-treating process.
Figure 2A:
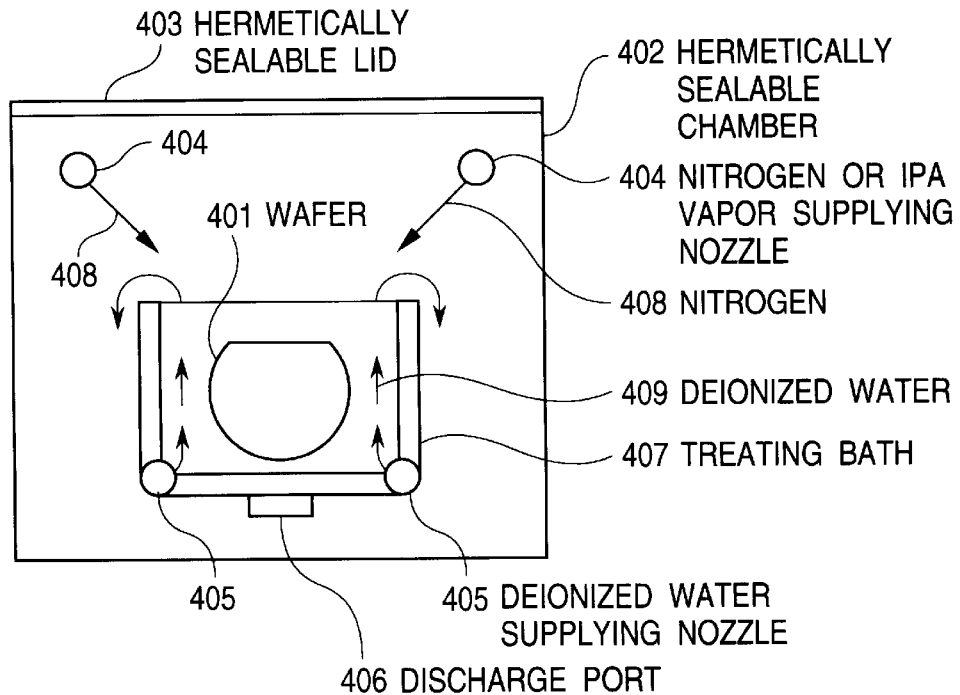
FIGS. 2A to 2H are diagrammatic sectional views of a single bath wet-treating unit, for illustrating an example of the prior art wafer etching and rinsing method in the single bath wet-treating process.
Figure 2B:
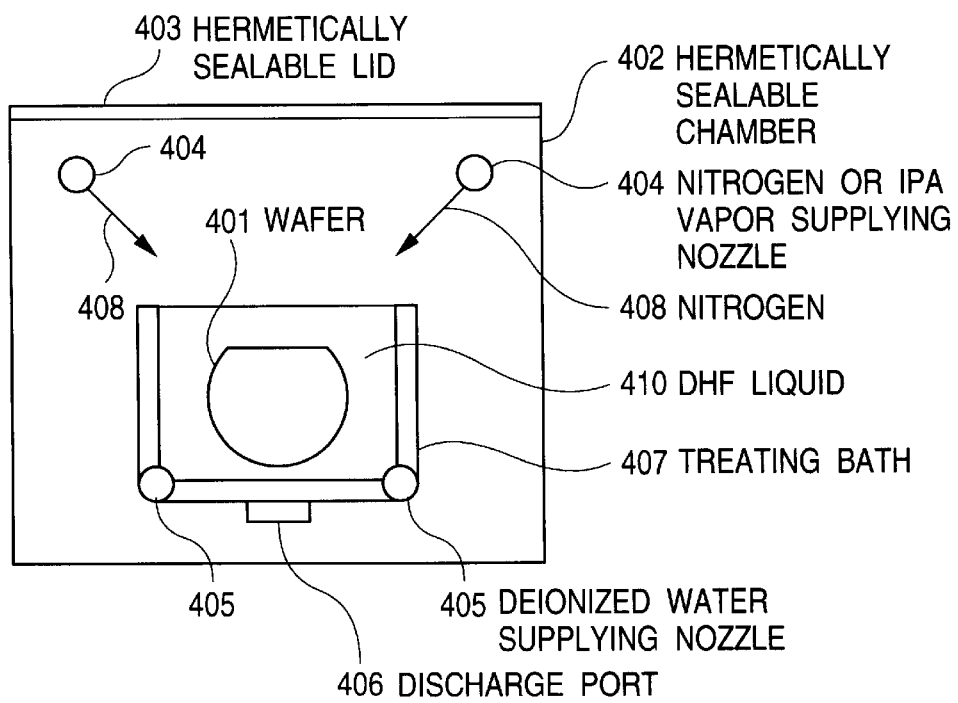
Figure 2C:
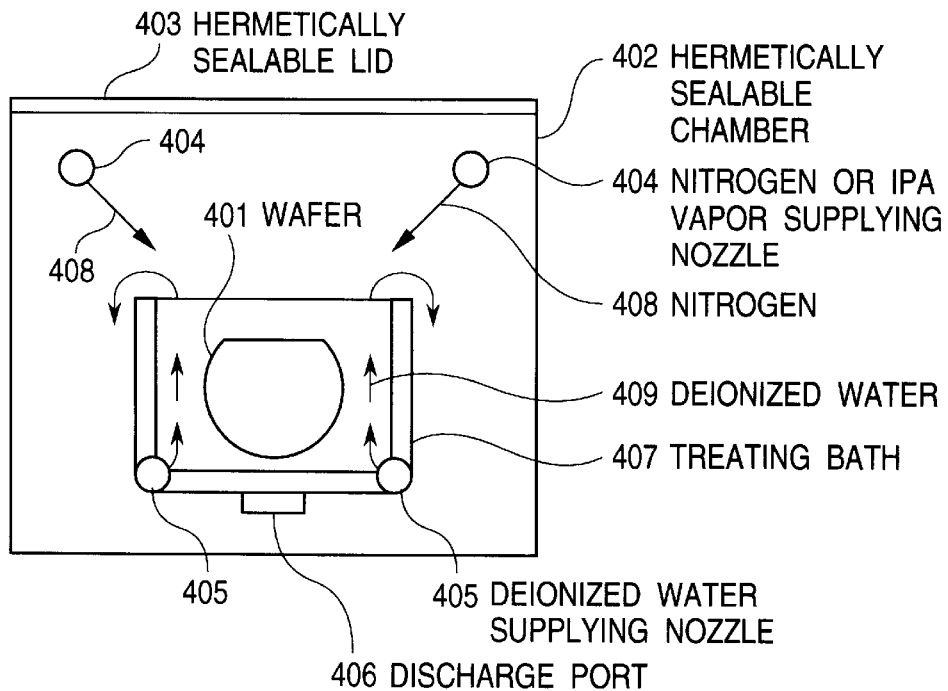
Figure 2D:
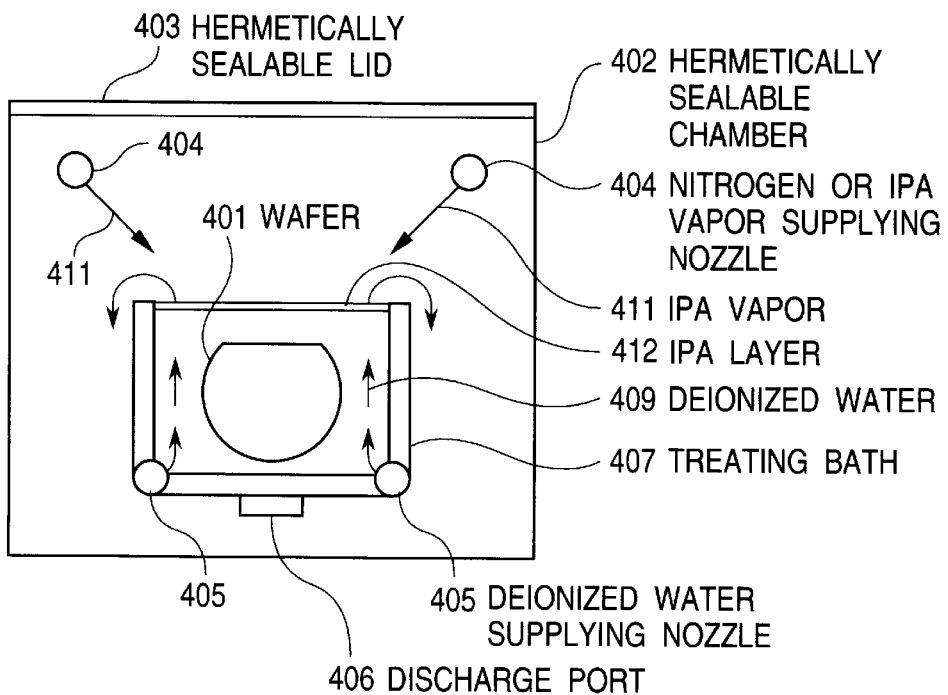
Figure 2E:
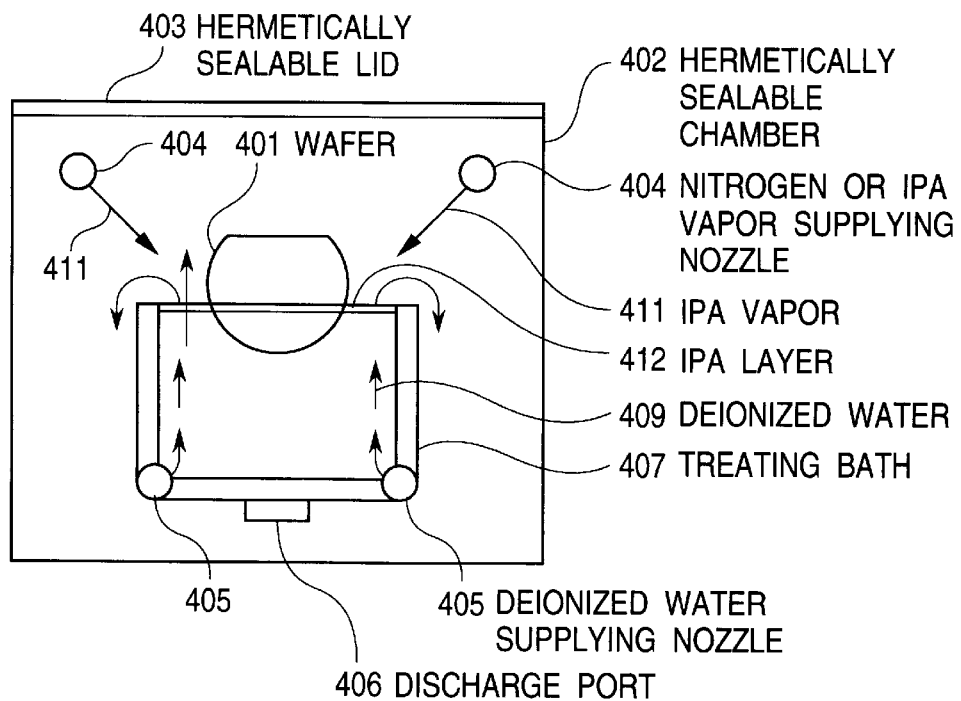
Figure 2F:
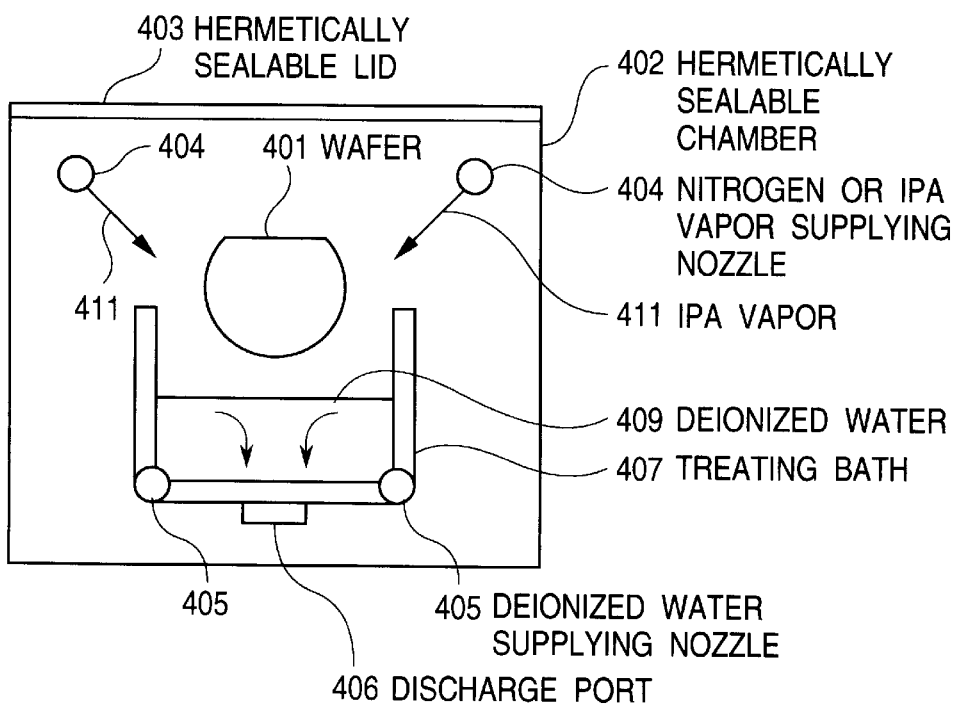
Figure 2G:
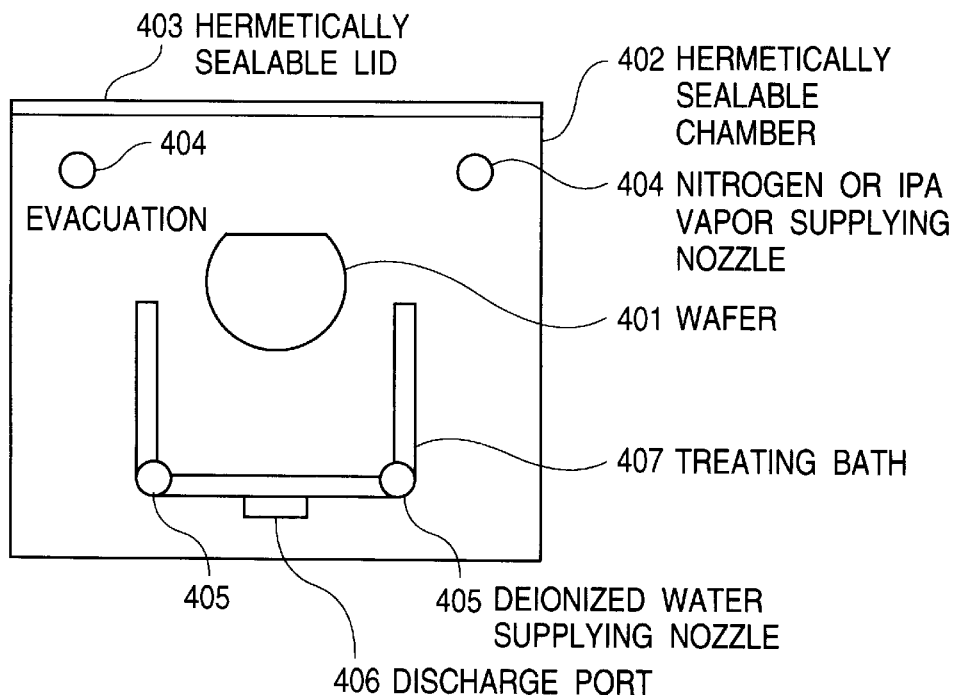
Figure 2H:
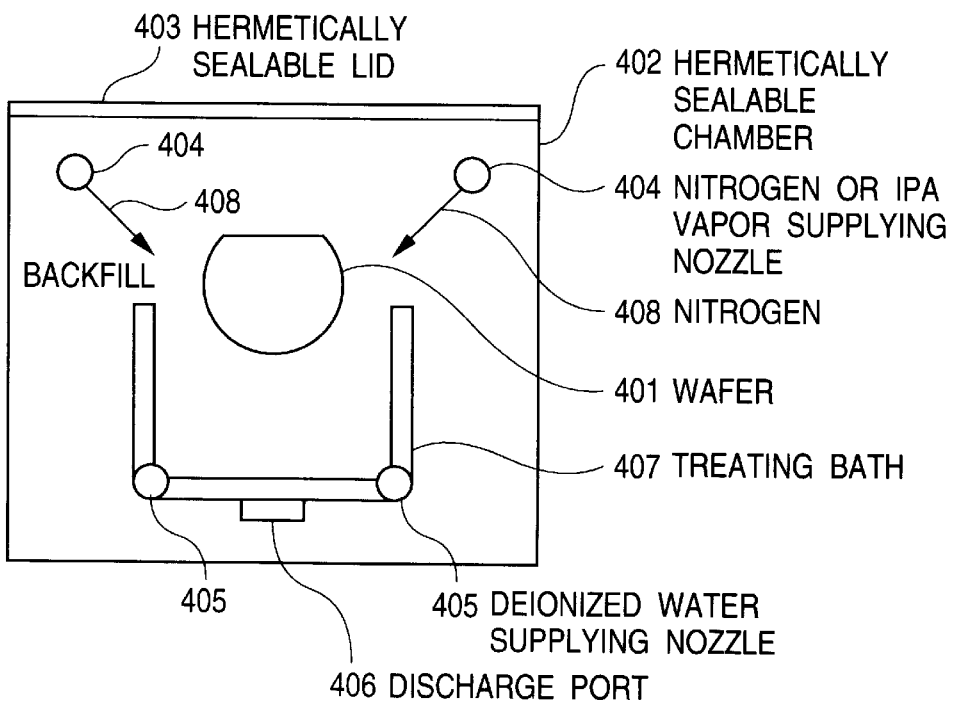

Now, embodiments of the wafer rinsing and drying method in accordance with the present invention will be described with reference to the accompanying drawings.

Embodiment 1

An embodiment of the wafer rinsing and drying method in accordance with the present invention utilizing a single bath wet-treating unit having an IPA drying function, will be described with FIGS. 3A to 3H. This single bath wet-treating unit shown in FIGS. 3A to 3H includes a hermetically sealable chamber 102 having a top closed and opened by a hermetically sealable lid 103. Within this hermetically sealable chamber 102, a treating bath 107 is located, and nitrogen or IPA vapor supplying nozzles 104 are mounted at a position higher than an upper edge of the bath 107 and are directed toward the bath 107. The treating bath 107 has, for example, deionized water supply nozzles 105 located at a peripheral portion of the bottom, and a discharge port 106 formed at a center of the bottom. Therefore, the single bath wet-treating unit shown in FIGS. 3A to 3H is substantially the same as that shown in FIGS. 2A to 2H, and therefore, a pipe layout for supplying necessary liquid and gas and for exhausting unnecessary liquid and gas is omitted for simplification of the drawing, similarly to FIGS. 2A to 2H.

Figure 3A:
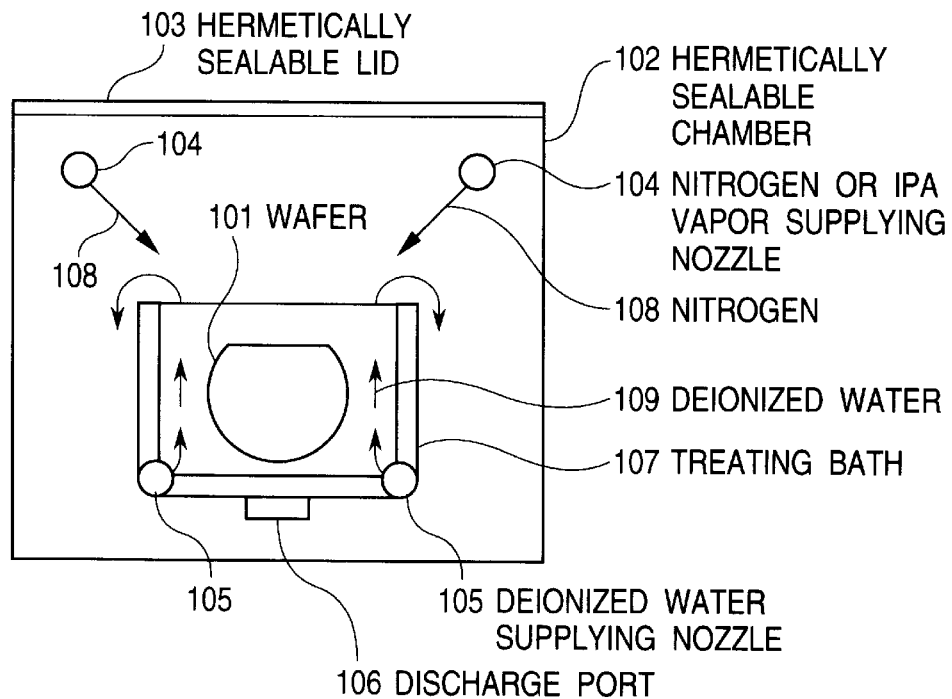
FIGS. 3A to 3H are diagrammatic sectional views of a single bath wet-treating unit, for illustrating a first embodiment of the wafer rinsing and drying method in accordance with the present invention.

First, as shown in FIG. 3A, a wafer 101 is introduced into the treating bath 107 by means of a conveying cassette (not shown) so that the wafer is immersed into, for example, deionized water 109 in the treating bath 107. Thereafter, the chamber 102 is closed with the lid 103 so as to complete a hermetically sealed space defined by the chamber 102 and the lid 103, and nitrogen is supplied through the nitrogen or IPA vapor supplying nozzles 104.

In this condition, the deionized water is supplied from the deionized water supplying nozzles 105 so that a rising stream of deionized water is generated within the treating bath 107. The wafer 101 is put into the rising stream of deionized water for a predetermined period of time, as shown in FIG. 3A. Thus, particles are removed from a surface of the wafer 101, and are exhausted from the treating bath 107 together with the deionized water 109 overflowing from an upper edge of the treating bath 107. At this time, in the case of the wafer having the diameter of 6 inches to 8 inches, the flow rate of the deionized water 109 is preferred to be about 20 to 24 liters/min.

Figure 3B:
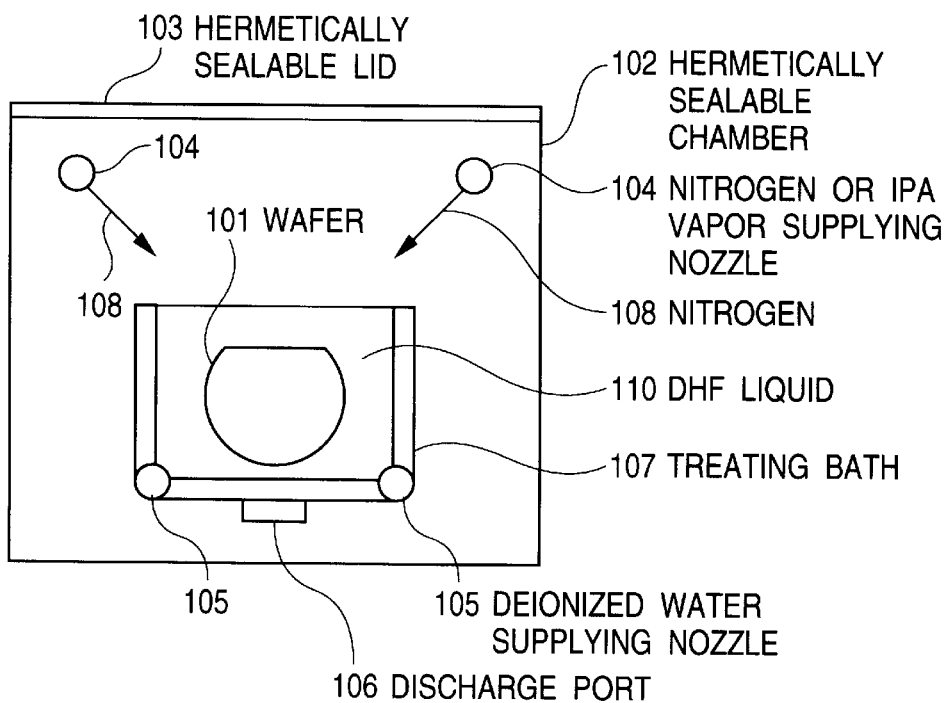

Then, without exposing the wafer 101 to the atmosphere, the deionized water 109 is replaced with a chemical solution, for example, the DHF liquid 110, which is therefore supplied in place of the deionized water, through the nozzles 105 so as to fill the treating bath 107 with the DHF liquid 110. Then an etching is carried out for a predetermined period of time, as shown in FIG. 3B.

Thereafter, without exposing the wafer 101 to the atmosphere, the DHF liquid 110 is replaced with the deionized water, which is therefore supplied through the nozzles 105, and the wafer 101 is rinsed with a rising stream of deionized water 109 for a predetermined period of time. In this process, an IPA vapor 111 is supplied toward an upper position of the treating bath 107 from the nitrogen or IPA vapor supplying nozzles 104, by using the nitrogen gas as a carrier. Here, the IPA can be replaced with another water soluble organic solvent acting to lower the surface tension of the deionized water, exemplified by the alcohol family, the ketone family and the ethyl family.

Figure 3C:
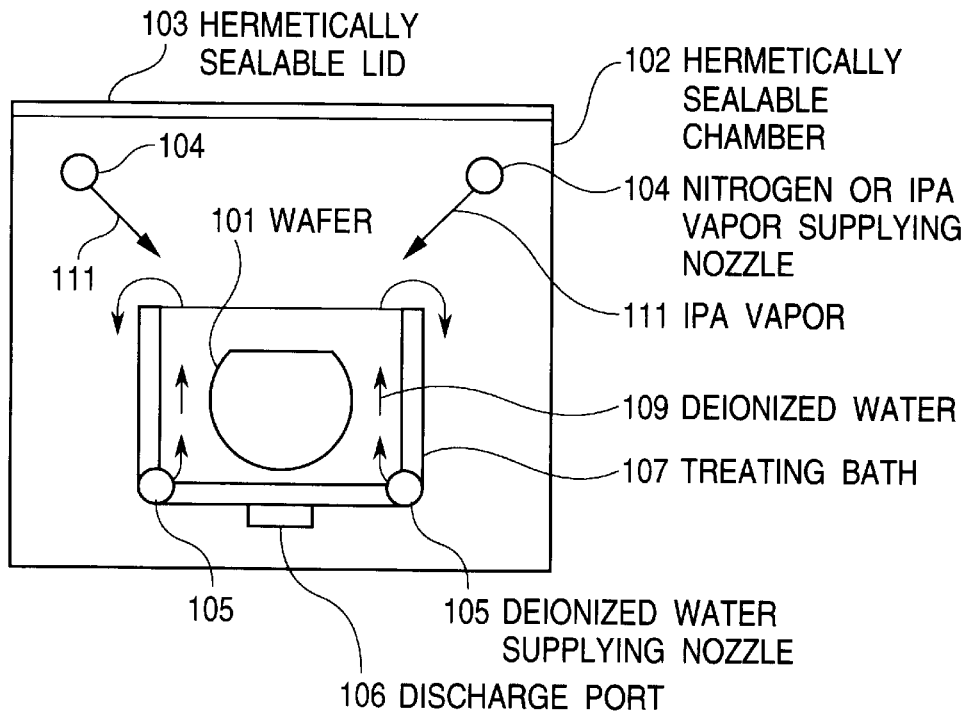

The IPA vapor 111 is cooled down by the surface of the deionized water 109, and liquefied to form a thin IPA film on the deionized water surface. As a result, the surface tension of the deionized water 109 is weakened, so that the deionized water is apt to be uniformly overflowed from the treating bath. Accordingly, particles removed from the surface of the wafer 101, and diffused into the deionized water 109, are uniformly exhausted from the treating bath 107 together with the deionized water 109 overflowing from an upper edge of the treating bath 107, as shown in FIG. 3C.

In this rinsing process, it is more effective to continue to blow the IPA vapor 111, but this is expensive. Therefore, it is possible to stop the blowing of the IPA vapor 111 in the method of this rinsing process. However, it is desirable to resume, i.e., continue to blow the IPA vapor 111 for a few minutes just before the termination of the rinsing process.

Figure 3D:
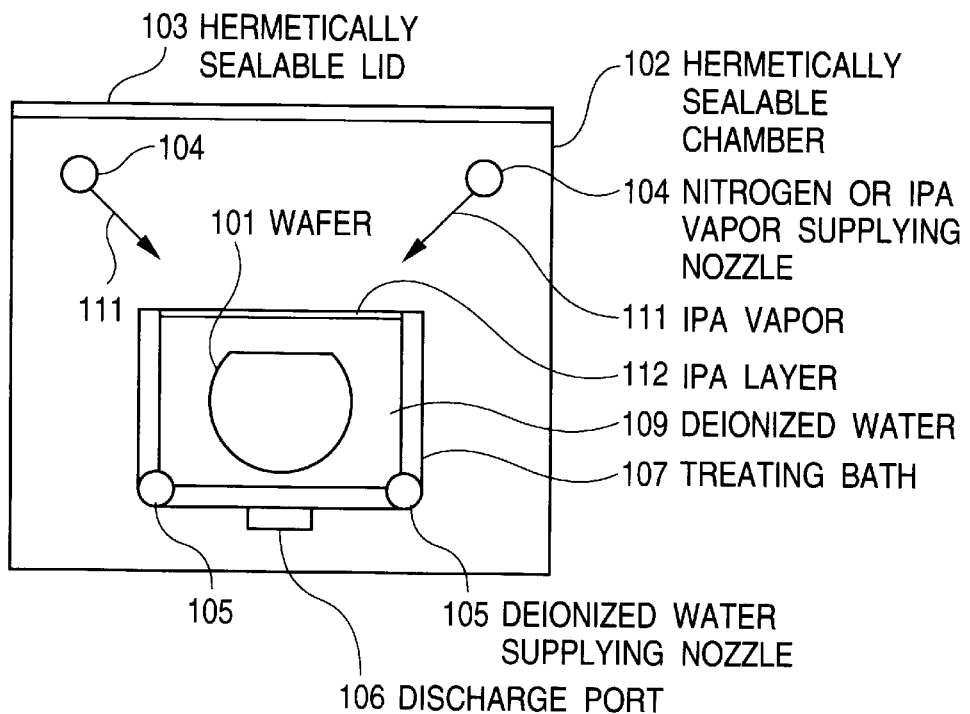
Figure 3E:
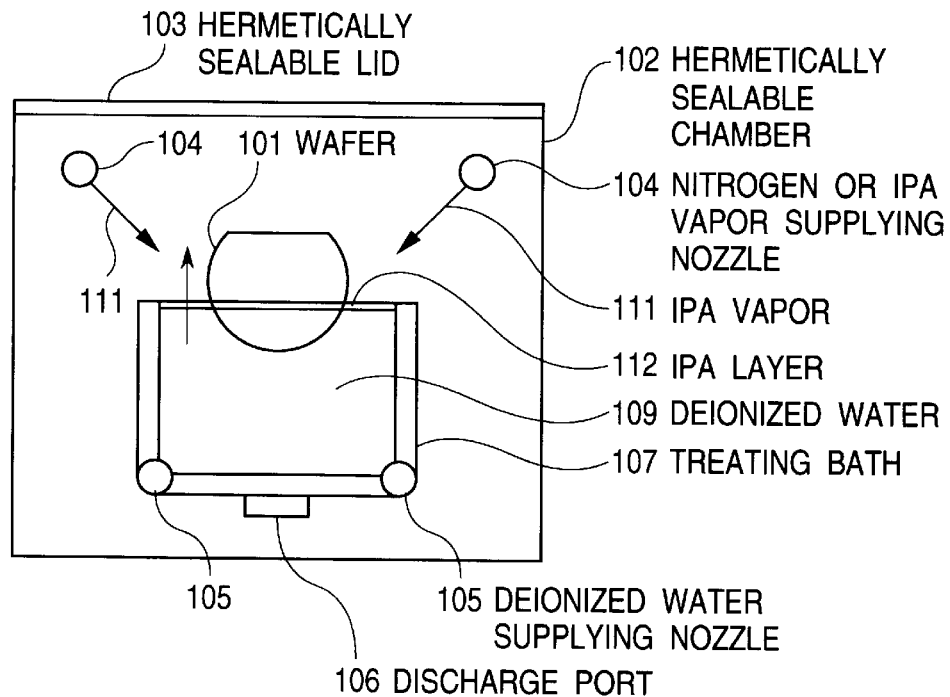

When the rinsing of the wafer 101 is completed the supplying of the deionized water 109 to the treating bath 107 is stopped. After predetermined period of time, i.e., a holding period, that may be, for example, about 60 seconds have elapsed, as shown in FIG. 3D, the wafer 101 is pulled up from the treating bath 107 at a speed of, for example, 5 mm/sec, as shown in FIG. 3E. In this process, since the deionized water on the wafer 101 is replaced with the IPA liquid, the wafer 101 will be dried quickly.

By stopping the supplying of the deionized water 109 and on the other hand by continuing to blow the IPA vapor for the predetermined period of time, the particles floating on the deionized water surface are reduced. In addition, the deionized water in the bath 107 becomes stationary, and a uniform thick IPA layer 112 is formed on the stationary deionized water surface.

Here, considering the heaving of the deionized water surface and the efficiency for replacing the deionized water on the wafer surface with the IPA liquid, the slower the pulling-up speed of the wafer from the bath is, the more preferable. The pulling-up speed of the wafer is preferred to be not higher than 6 mm/sec.

Figure 3F:
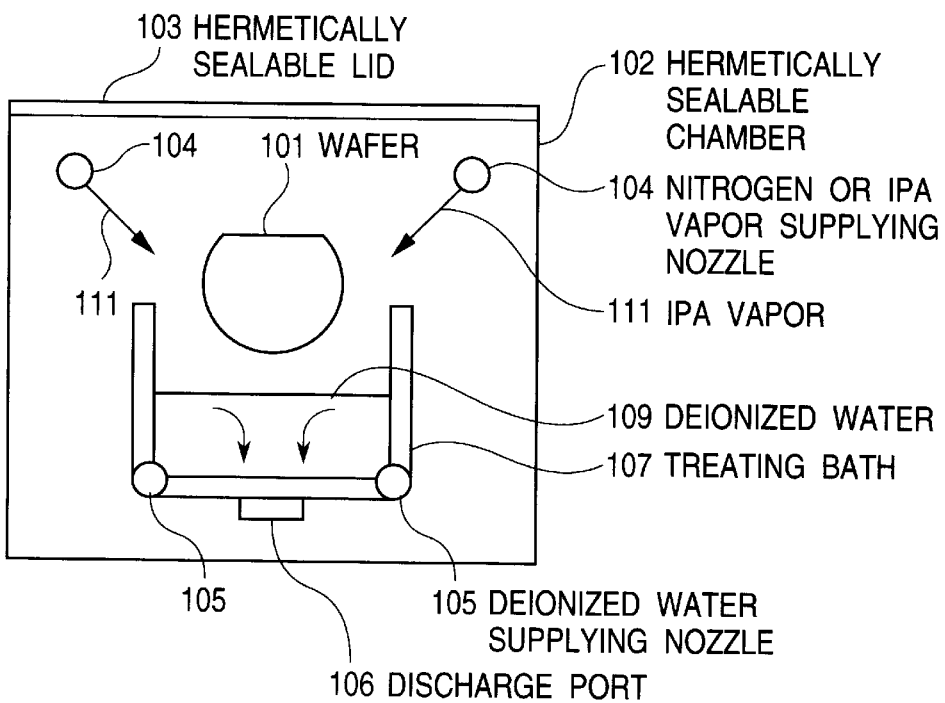

If the pulling-up of the wafer 101 from the deionized water 109 is completed, the supplying of the IPA vapor 111 is stopped, and the supplying of the nitrogen 108 is started. Simultaneously, the deionized water 109 is discharged from the treating bath 107 through the discharge port 106, as shown in FIG. 3F.

Figure 3G:
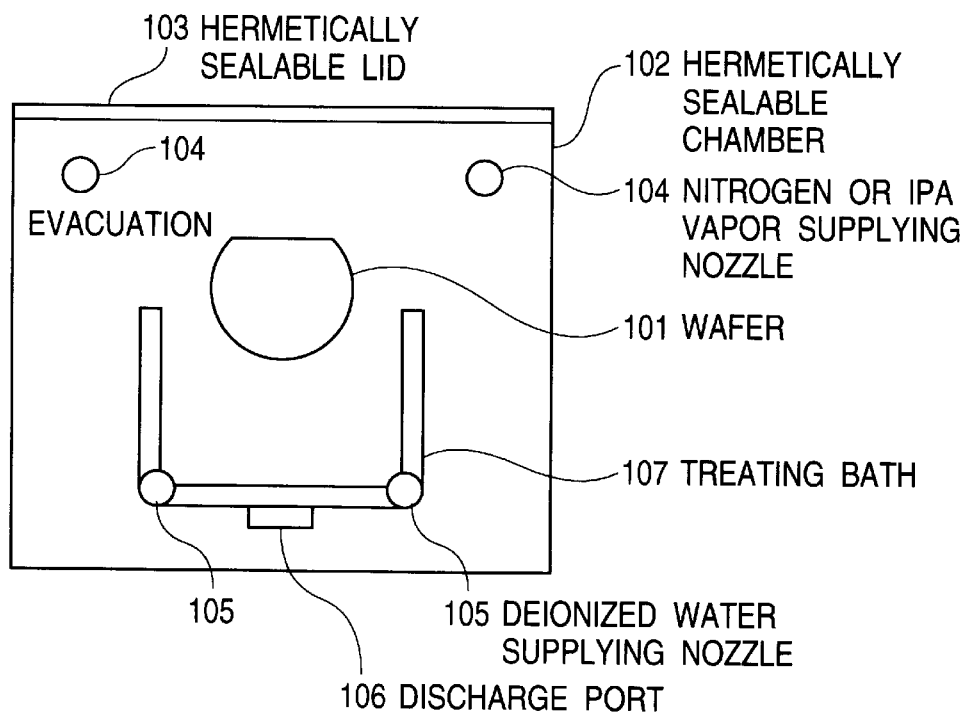

After the deionized water 109 has been discharged from the treating bath 107, the supplying of the nitrogen gas is stopped. At the same time, the hermetically sealed chamber 102 is evacuated by a vacuum pump (not shown) so that the hermetically sealed chamber 102 is put in a reduced pressure condition. The result is that the IPA on the surface of the wafer 101, which was substituted for the deionized water, is caused to evaporate, and therefore the wafer 101 is dried, as shown in FIG. 3G.

Figure 3H:
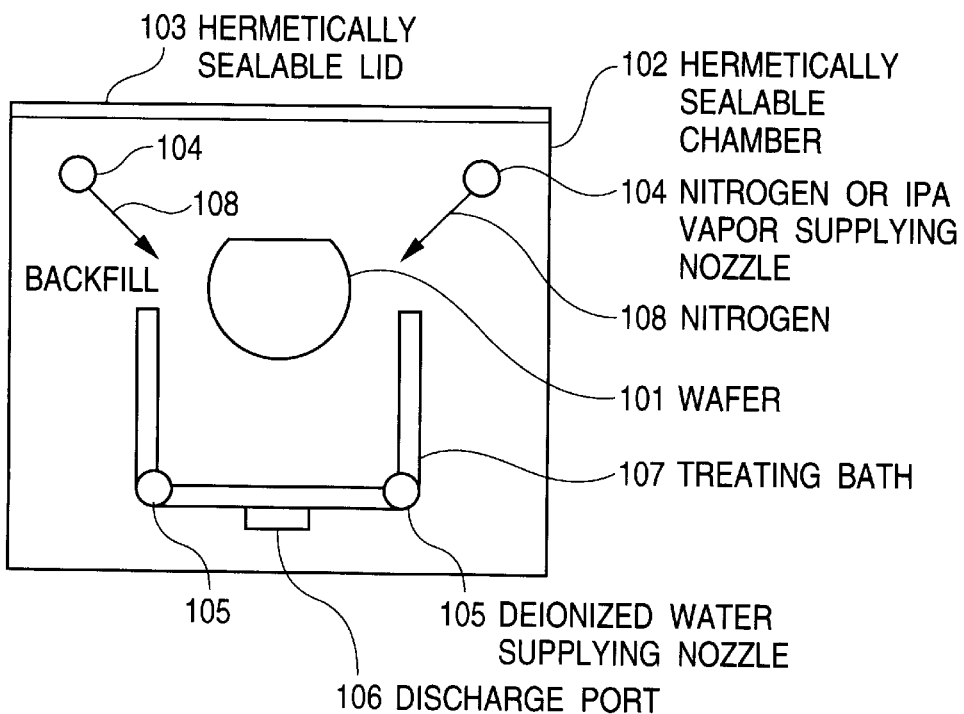

After completion of the drying of the wafer 101, the supplying of the nitrogen gas 108 is started. Thereafter when a time of, for example, about 30 seconds has elapsed, the vacuum pump is stopped, so that the pressure in the hermetically sealed chamber 102 is restored from the reduced pressure condition to the pressure of the atmosphere, as shown in FIG. 3H.

After the pressure of the atmosphere is restored, the lid 103 is opened, and the wafer 101 is taken out.

Embodiment 2

The above mentioned first embodiment is of a wafer rinsing and drying method in accordance with the present invention as is applied to a single bath wet-process utilizing an IPA drying. However, the wafer rinsing and drying method in accordance with the present invention can also be applied to a multi-bath wet-process. Since the chemical liquids can be circulated in the multi-bath wet-process, the invention can be applied to any wet-process without being limited to a diluted process. However, since the wafer is conveyed in the atmosphere, the effect of minimizing the particles and the water marks is lowered in comparison with the single bath wet-process. In particular, for example, in the HSG-Si process in which an extremely fine remaining water gives an adverse effect, the effect of minimizing the particles and the water marks is not so appreciable. In the other processes, however, the effect of minimizing the particles and the water marks is remarkably advantageous in comparison with the prior art rinsing and drying method.

Now, an embodiment of the wafer rinsing and drying method in accordance with the present invention, as applied to a multi-bath wet-treating process, will be described with FIGS. 4 and 5A to 5F.

Figure 4:
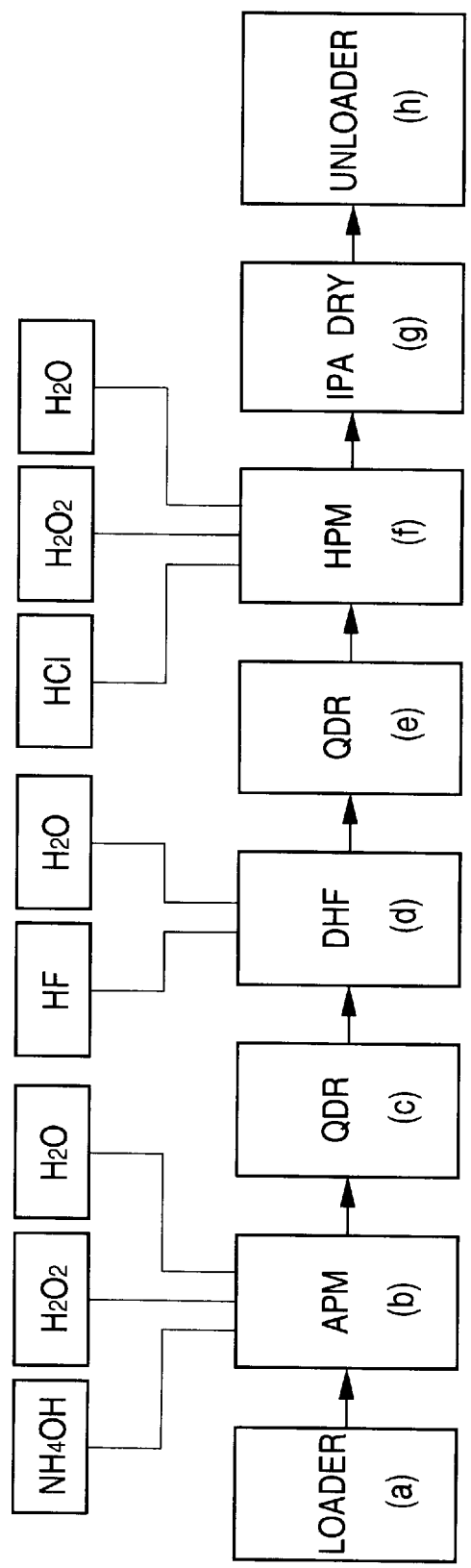
FIG. 4 illustrates a flow of a second embodiment of the wafer rinsing and drying method in accordance with the present invention.

Referring to FIG. 4, first, a wafer is mounted on a loader "(a)" in FIG. 4, and then is fed through an APM chemical bath "(b)", a DHF chemical bath "(d)" and an HPM chemical bath "(f)", in the named order, to a final rinsing bath "(g)". Here, a QDR (quick dump rinse) bath "(c)" or "(e)" is located between each pair of adjacent chemicals baths, in order to rinse the wafer with, for example, deionized water, thereby to prevent the chemicals from entering into the next downstream chemical bath. However, no QDR bath is provided next to the HPM chemical, bath "(f)", and therefore, the wafer is conveyed from the HPM chemical bath "(f)" directly to the final rinsing bath "(g)" without passing through the QDR bath.

Only the final rinsing bath "(g)" has a hermetically sealable structure, as shown in FIGS. 5A to 5F, which are diagrammatic sectional views of the final rinsing bath "(g)" for illustrating the rinsing and drying process carried out in the final rinsing bath "(g)".

As seen from comparison between FIGS. 3A to 3H and FIGS. 5A to 5F, the final rinsing bath "(g)" has the same structure as that of the single bath wet-treating unit shown in FIGS. 3A to 3H. Therefore, in FIGS. 5A to 5F, elements corresponding to those shown in FIGS. 3A to 3H are given the Reference Numerals obtained by adding "100" to the Reference Numerals given in FIGS. 3A to 3H, and explanation will be omitted for simplification of description.

Now, the rinsing and drying process carried out in the final rinsing bath "(g)" will be described with reference to FIGS. 5A to 5F.

First, as shown in FIG. 5A, the wafer 201 is immersed into deionized water 209 in the treating bath 207, and the chamber 202 is closed with the lid 203 so as to complete a hermetically sealed space defined by the chamber 202 and the lid 203. Furthermore, nitrogen is supplied through the nitrogen or IPA vapor supplying nozzles 204.

Thereafter, a vapor 210 of the IPA which is a water soluble organic solvent acting to lower the surface tension of the deionized water, is supplied toward an upper position of the treating bath 207 from the nitrogen or IPA vapor supplying nozzles 204, by using the nitrogen gas as a carrier. Accordingly, particles removed from the surface of the wafer 201 and diffused into the deionized water 209, are uniformly exhausted from the treating bath 207 together with the deionized water 209 supplied from the deionized water supplying nozzles 205 and overflowing from an upper edge of the treating bath 207, as shown in FIG. 5A.

Figure 5C:
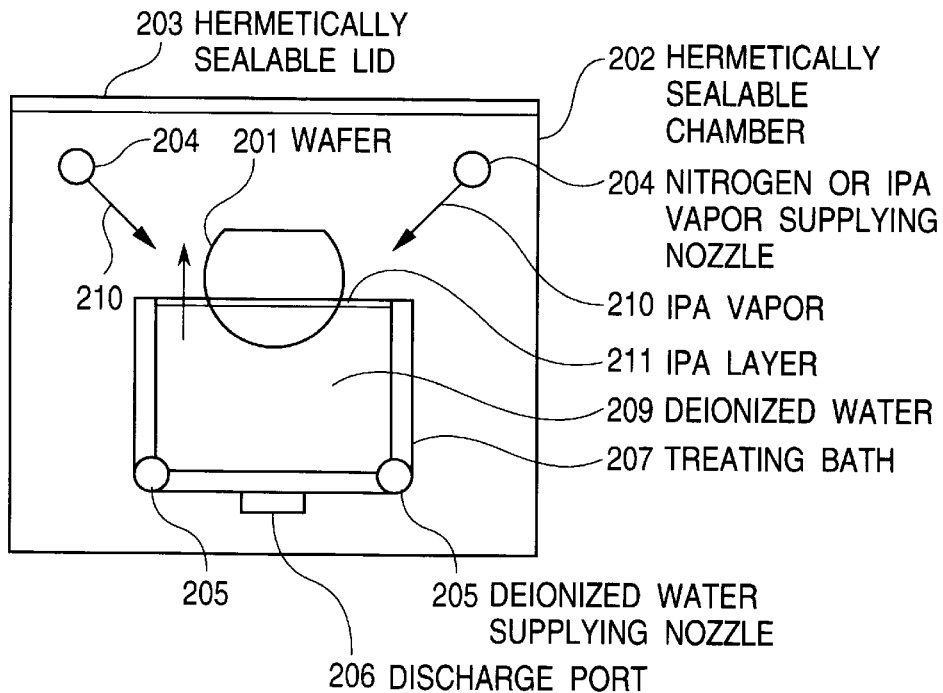

When the rinsing of the wafer 201 is completed, the supplying of the deionized water 209 to the treating bath 207 is stopped, and after a predetermined period of time, i.e., a holding period, that may be, for example, about 60 seconds have elapsed, so as to allow the surface of the deionized water 209 in the bath 207 to become stationary and to allow a uniform and thick IPA layer 211 to be formed on the stationary surface of the deionized water 209 in the bath 207 as shown in FIG. 5B, the wafer 201 is pulled up from the treating bath 207 at a speed of, for example, 5 mm/sec, as shown in FIG. 5C. In this process, the deionized water on the wafer 201 is replaced with the IPA, so that the wafer 201 will be dried quickly. Here, the pulling-up speed of the wafer is preferably not higher than 6 mm/sec.

Figure 5D:
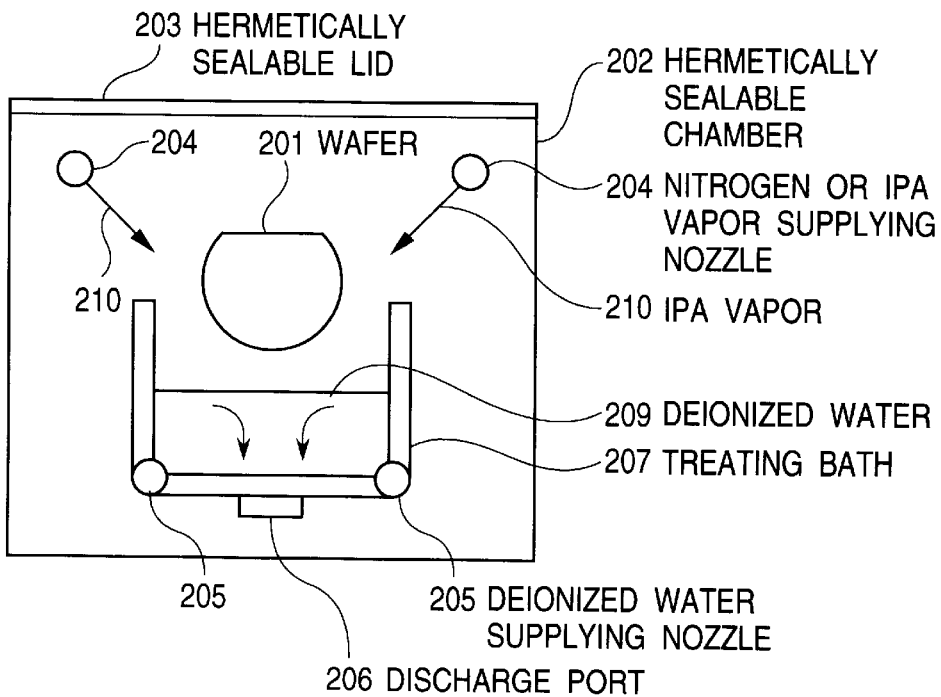

After the pulling-up of the wafer 201 from the deionized water 209 is completed, the supplying of the IPA vapor 210 is stopped, and the supplying of the nitrogen 208 is started. Simultaneously, the deionized water 209 is discharged from the treating bath 207 through the discharge port 206, as shown in FIG. 5D.

Figure 5E:
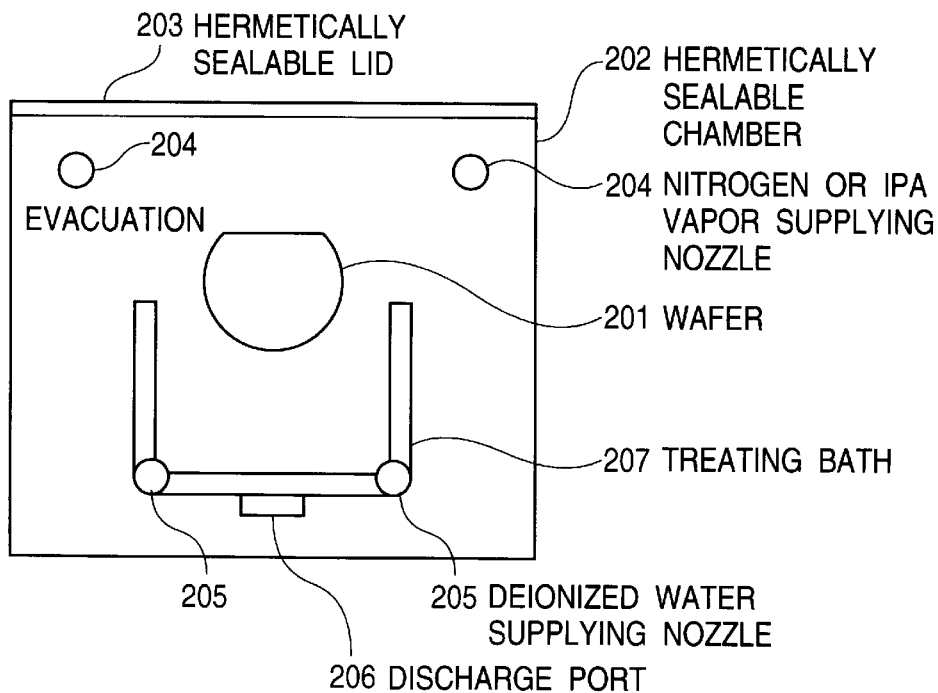

After the deionized water 209 has been discharged from the treating bath 207, the supplying of the nitrogen gas is stopped, and at the same time, the hermetically sealed chamber 202 is evacuated by a vacuum pump (not shown) so that the hermetically sealed chamber 202 is put in a reduced pressure condition, with the result that the IPA on the surface of the wafer 201, which was substituted for the deionized water, is caused to evaporate, and therefore, the wafer 201 is dried, as shown in FIG. 5E.

Figure 5F:
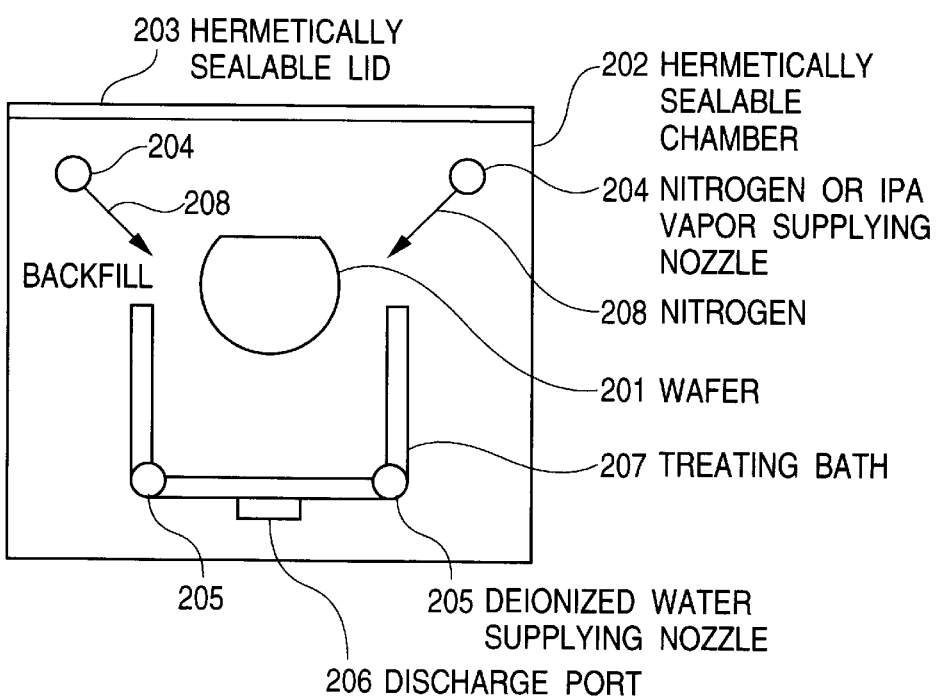

After completion of the drying of the wafer 201, the supplying of the nitrogen gas 208 is started, and thereafter, when a time of, for example, about 30 seconds has elapsed, the vacuum pump is stopped, so that the pressure in the hermetically sealed chamber 202 is restored from the reduced pressure condition to the pressure of the atmosphere, as shown in FIG. 5F.

After the pressure of the atmosphere is restored, the lid 203 is opened, and the wafer 201 is transferred to an unloader "(h)" as shown in FIG. 4.

In the prior art rinsing and drying method, since the wet-treated wafer is rinsed in the nitrogen atmosphere, it was difficult to sufficiently exhaust the particles. In addition, since the organic solvent vapor is blown against the rising stream of deionized water before the pulling-up of the wafer from the deionized water bath, the organic solvent layer on the deionized water bath was very thin and was not formed uniformly. As a result, the particles were still adhered to the wafer, and many water marks were generated on the wafer.

In the present invention, on the other hand, when the wet-treated wafer is rinsed in the rising stream of deionized water, the water soluble organic solvent vapor acting to lower the surface tension of the deionized water is blown against the surface of the deionized water bath. Therefore, since the surface tension of the surface of the deionized water bath is weakened, the extremely fine particles remaining on the surface of the deionized water bath can be removed together with the deionized water overflowing from the upper edge of the treating bath.

Furthermore, after the supply of the deionized water is stopped, when a predetermined period of time has elapsed to allow to form the stationary deionized water bath and also to form a uniform and thick organic solvent liquid layer on the surface of the stationary deionized water bath, the wafer is pulled up. Therefore, the particles and the water marks can be greatly reduced in comparison with the prior art rinsing and drying method, as shown in FIG. 6 is a graph showing the relation between the run number and the number of particles / water marks in the wafer rinsing and drying method in accordance with the present invention and in the prior art wafer rinsing and drying method. As seen from FIG. 6, it is understood that the yield of production can be elevated by the rinsing and drying method in accordance with the present invention.

The invention has thus been shown and described with reference to the specific embodiments. However, it should be noted that the present invention is in no way limited to the details of the illustrated structures but changes and modifications may be made within the scope of the appended claims.

We claim:

1. A wafer rinsing and drying method including
    a first step of rinsing a wet-treated wafer, that is in a treating bath, by a rising stream of deionized water while supplying a vapor of a first water soluble organic solvent acting to lower the surface tension of said deionized water,
    a second step following said first step of stopping said rising stream of said deionized water and of supplying a vapor of a second water soluble organic solvent acting to lower the surface tension of said deionized water for a predetermined period of time, and after said second step, then
    a third step of pulling up said wafer from said treating bath.

2. A wafer rinsing and drying method claimed in claim 1 wherein each of said first and second water soluble organic solvents acting to lower the surface tension of the deionized water is at least one organic solvent selected from the group consisting of the alcohol family, the ketone family and the ethyl family.

3. A wafer rinsing and drying method claimed in claim 2 wherein in said second step, said vapor of said second water soluble organic solvent is continuously supplied for a period of time sufficient to allow said deionized water in said treating bath to become substantially stationary and also to allow a substantially uniform liquid layer of said second water soluble organic solvent to be formed on the surface of said deionized water.

4. A wafer rinsing and drying method claimed in claim 3 wherein in said second step, said period of time is not less than 30 seconds.

5. A wafer rinsing and drying method claimed in claim 4 wherein in said third step, said wafer is pulled up from said treating bath at a pulling-up speed of not greater than 6 mm/sec.

6. A wafer rinsing and drying method claimed in claim 1 wherein in said second step, said vapor of said second water soluble organic solvent is continuously supplied for a period of time sufficient to allow said deionized water in said treating bath to become substantially stationary and also to allow a substantially uniform liquid layer of said second water soluble organic solvent to be formed on the surface of said deionized water.

7. A wafer rinsing and drying method claimed in claim 6 wherein in said second step, said period of time is not less than 30 seconds.

8. A wafer rinsing and drying method claimed in claim 7 wherein in said third step, said wafer is pulled up from said treating bath at a pulling-up speed of not greater than 6 mm/sec.

9. A wafer rinsing and drying method claimed in claim 1 wherein in said second step, said vapor of said second water soluble organic solvent is continuously supplied for a period of time of not less than 30 seconds.

10. A wafer rinsing and drying method claimed in claim 9 wherein each of said first and second water soluble organic solvents acting to lower the surface tension of the deionized water is at least one organic solvent selected from the group consisting of the alcohol family, the ketone family and the ethyl family.

11. A wafer rinsing and drying method as claimed in claim 1, wherein said vapor of said first water soluble organic solvent of said first step is supplied from a position higher than said treating bath, and
    said vapor of said second water soluble organic solvent of said second step is supplied from a position higher than said treating bath.

12. A wafer rinsing and drying method as in claim 3 wherein said substantially uniform liquid layer is thick.

13. A wafer rinsing and drying method as in claim 6 wherein said substantially uniform liquid layer is thick.

14. A substrate rinsing and drying method including
    a first step of rinsing a wet-treated substrate that is in a treating bath, by a rising stream of a rinsing fluid while supplying a vapor of a first soluble organic solvent acting to lower the surface tension of said rinsing fluid,
    a second step following said first step of stopping said rising stream of said rinsing fluid and of supplying a vapor of a second soluble organic solvent acting to lower the surface tension of said rinsing fluid for a holding period, and after said second step, then
    a third step of pulling up said substrate from said treating bath.

15. A substrate rinsing and drying method as in claim 14 wherein said rinsing fluid comprises deionized water.

16. A substrate rinsing and drying method as in claim 14 wherein said holding period is at least 30 seconds.

17. A substrate rinsing and drying method as in claim 14 wherein in said second step, said vapor of said second soluble organic solvent is continuously supplied for a holding period sufficient to allow said rinsing fluid in said treating bath to become substantially stationary and also to allow a substantially uniform liquid layer of said second soluble organic solvent to be formed on the surface of said rinsing fluid.

18. A substrate rinsing and drying method as in claim 17 wherein said substantially uniform liquid layer is thick prior to termination of said holding period.

19. A substrate rinsing and drying method as in claim 14 wherein each of said first and second soluble organic solvents acting to lower the surface tension of the rinsing fluid is at least one organic solvent selected from the group consisting of the alcohol family, the ketone family and the ethyl family.

20. A substrate rinsing and drying method as in claim 14 wherein said vapor of said first soluble organic solvent of said first step is supplied from a position higher than said treating bath, and said vapor of said second soluble organic solvent of said second step is supplied from a position higher than said treating bath.

21. A substrate rinsing and drying method as in claim 14 wherein said holding period is about 60 seconds.

\* \* \* \* \*